United States Patent
Joe et al.

(10) Patent No.: US 9,678,165 B2
(45) Date of Patent: Jun. 13, 2017

(54) APPARATUS FOR ESTIMATING DEPTH OF DISCHARGE (DOD) OF SECONDARY BATTERY

(71) Applicant: LG CHEM, LTD., Seoul (KR)

(72) Inventors: Won-Tae Joe, Daejeon (KR); Sun-Young Cha, Daejeon (KR)

(73) Assignee: LG CHEM, LTD., Seoul (KR)

( * ) Notice: Subject to any disclaimer, the term of this patent is extended or adjusted under 35 U.S.C. 154(b) by 99 days.

(21) Appl. No.: 14/424,622

(22) PCT Filed: Dec. 4, 2013

(86) PCT No.: PCT/KR2013/011176
§ 371 (c)(1),
(2) Date: Feb. 27, 2015

(87) PCT Pub. No.: WO2014/088325
PCT Pub. Date: Jun. 12, 2014

(65) Prior Publication Data
US 2015/0226809 A1 Aug. 13, 2015

(30) Foreign Application Priority Data

Dec. 4, 2012 (KR) .................. 10-2012-0139750
Dec. 4, 2013 (KR) .................. 10-2013-0149795

(51) Int. Cl.
*G01N 27/416* (2006.01)
*G01R 31/36* (2006.01)
(Continued)

(52) U.S. Cl.
CPC ....... *G01R 31/3651* (2013.01); *G01R 31/362* (2013.01); *G01R 31/3606* (2013.01);
(Continued)

(58) Field of Classification Search
CPC ............ G01R 31/3648; G01R 31/3627; G01R 31/3662; G01R 31/3631; Y02E 60/12
(Continued)

(56) References Cited

U.S. PATENT DOCUMENTS 5,703,465 A 12/1997 Kinoshita et al.
6,377,030 B1 4/2002 Asao et al.
(Continued)

FOREIGN PATENT DOCUMENTS

JP 6-342044 A 12/1994
JP 2002-250757 A 9/2002
(Continued)

OTHER PUBLICATIONS

International Search Report issued in PCT/KR2013/011176, mailed on Mar. 14, 2014.
(Continued)

Primary Examiner — Arun Williams
(74) Attorney, Agent, or Firm — Birch, Stewart, Kolasch & Birch, LLP

(57) ABSTRACT

Disclosed is an apparatus and method for estimating a parameter of a secondary battery. The apparatus includes a sensor unit configured to repeatedly measure a voltage of a secondary battery including a blended cathode material containing at least first and second cathode materials at time intervals when the secondary battery is in an operation state or in an idle state, and a control unit configured to receive the repeatedly measured plurality of voltages from the sensor unit, identify an inflection point in a voltage change profile corresponding to the plurality of voltages, and estimate a depth of discharge (DOD) of the secondary battery by using a voltage measured after the inflection point is identified as a reference voltage.

24 Claims, 11 Drawing Sheets

(51) Int. Cl.

| | | |
|---|---|---|
| *H01M 10/48* | (2006.01) | |
| *H01M 4/36* | (2006.01) | |
| *G01R 19/165* | (2006.01) | |
| *H01M 4/131* | (2010.01) | |
| *H01M 4/505* | (2010.01) | |
| *H01M 4/525* | (2010.01) | |
| *H01M 4/58* | (2010.01) | |
| *H01M 10/052* | (2010.01) | |

(52) U.S. Cl.
CPC ........... *H01M 4/364* (2013.01); *H01M 10/48* (2013.01); *G01R 19/16542* (2013.01); *H01M 4/131* (2013.01); *H01M 4/505* (2013.01); *H01M 4/525* (2013.01); *H01M 4/5825* (2013.01); *H01M 10/052* (2013.01)

(58) Field of Classification Search
USPC ......................................................... 324/426
See application file for complete search history.

(56) References Cited

U.S. PATENT DOCUMENTS

| | | | |
|---|---|---|---|
| 6,420,851 B1 | 7/2002 | Schoofs et al. | |
| 6,677,082 B2 | 1/2004 | Thackeray et al. | |
| 6,680,143 B2 | 1/2004 | Thackeray et al. | |
| 2005/0017685 A1* | 1/2005 | Rees | G01R 31/3679 320/132 |
| 2005/0017687 A1* | 1/2005 | Nagaoka | H02J 7/0047 320/132 |
| 2009/0027056 A1* | 1/2009 | Huang | B60L 11/1857 324/439 |
| 2012/0158330 A1 | 6/2012 | Araki | |
| 2012/0176092 A1* | 7/2012 | Fujii | G01R 31/361 320/134 |
| 2012/0293131 A1 | 11/2012 | Nakamura et al. | |
| 2013/0346000 A1* | 12/2013 | Joe | H01M 10/052 702/63 |

FOREIGN PATENT DOCUMENTS

| | | |
|---|---|---|
| JP | 2007-103187 A | 4/2007 |
| JP | 2007-250299 A | 9/2007 |
| JP | 2011-43460 A | 3/2011 |
| KR | 10-2001-0052705 A | 6/2001 |
| KR | 10-2003-0013215 A | 2/2003 |
| KR | 10-1097956 B1 | 12/2011 |
| KR | 10-2012-0123346 A | 11/2012 |
| WO | WO 00/62086 A1 | 10/2000 |

OTHER PUBLICATIONS

Nicolai et al., "From Nickle-Cadmium to Nickel-Hybride Fast Battery Charger", Power Electronics and Drive Systems, 1995. Proceedings of the 1995 International Conference on Singapore, Feb. 21-24, 1995, pp. 786-791.

* cited by examiner

APPARATUS FOR ESTIMATING DEPTH OF DISCHARGE (DOD) OF SECONDARY BATTERY

TECHNICAL FIELD

The present disclosure relates to an apparatus and method for estimating a depth of discharge (DOD) of a secondary battery.

The present application claims priority to Korean Patent Application No, 10-2012-0139750 filed on Dec. 4, 2012 and Korean Patent Application No. 10-2013-0149795 filed on Dec. 4, 2013 in the Republic of Korea, the disclosures of which are incorporated herein by reference.

BACKGROUND ART

A battery is a device that produces electrical energy through electrochemical oxidation and reduction reactions, and has a wide range of various applications. For example, application of a battery is gradually expanding to a power source of handheld portable devices such as a mobile phone, a laptop computer, a digital camera, a video camera, and an electric tool; various types of electric-powered devices such as an electric bike, an electric motorcycle, an electric vehicle, a hybrid vehicle, an electric boat, and an electric aircraft; an energy storage system used to store energy produced through new renewable energy or excess energy in an electricity-generating plant; and an uninterruptible power supplier for stable power supply to various information and communication devices including a server computer and a base station for wireless communication.

A battery includes three basic elements; one is an anode including a material which oxides while emitting electrons during discharging, another is a cathode including a material which reduces while accepting electrons during discharging, and the other is an electrolyte which allows ions to move between the anode and the cathode.

A battery may be classified into a primary battery that cannot be reused after discharged, and a secondary battery that can be charged and discharged repeatedly due to at least partially reversible electrochemical reactions.

As a secondary battery, a lead-acid battery, a nickel-cadmium battery, a nickel-zinc battery, a nickel-iron battery, a silver-oxide battery, a nickel metal hydride battery, a zinc-manganese dioxide battery, a zinc-bromine battery, a metal-air battery, and a lithium secondary battery are known. Among them, a lithium secondary battery has a higher energy density, a higher battery voltage, and a longer lifespan than the other secondary batteries, and for these reasons, is attracting the greatest attention in commercial aspects.

A lithium secondary battery has a characteristic that intercalation and deintercalation reactions of lithium ions occur at a cathode and an anode. That is, during discharging, lithium ions deintercalated from an anode material included in an anode moves to a cathode through an electrolyte and are intercalated into a cathode material included in the cathode, and vice versa during charging.

In the lithium secondary battery, because a material used as a cathode material significantly affects performance of the secondary battery, various attempts have been made to provide a cathode material having a high energy capacity while maintaining stability at high temperature as well as having low manufacturing costs. However, use of only one cathode material has a limitation in satisfying all the industrial performance requirements.

Recently with the growing concerns on exhaustion of fossil fuels and air pollution, there is a drastic increase in demand for eco-friendly energy. In this context, commercialization of an electric drive vehicle such as an electric vehicle or a hybrid vehicle that is powered and runs by electrical energy supplied from a secondary battery is being accelerated by developed countries.

When an electric drive vehicle runs, a depth of discharge (DOD) of a secondary battery is a parameter needed to estimate a residual driving distance of the electric drive vehicle, and to control the start and end of the charge or discharge of the secondary battery.

The DOD is a parameter representing a relative ratio of a capacity discharged up to now in comparison to the capacity of a secondary battery in a fully charged state, and the DOD may be estimated correctly by measuring an open-circuit voltage of the secondary battery. This is because a DOD of a secondary battery has a one-to-one relationship with an open-circuit voltage of the secondary battery. However, it is not easy to exactly measure an open-circuit voltage of a secondary battery during charging or discharging of the secondary battery.

Accordingly, conventionally, complex mathematical models or an experimentally-made lookup table capable of mapping an open-circuit voltage with temperature and voltage of the secondary battery were used to estimate an open-circuit voltage of a secondary battery.

However, the former method has a disadvantage of requiring a complicated calculation, and the latter method has a drawback in that accuracy reduces when applied during charging or discharging of a secondary battery under a dynamic condition. Particularly, in the case of an electric vehicle or a hybrid vehicle, when a driver works an accelerator pedal, a secondary battery is discharged at rapidly changing discharge rates (C-rate), and when the driver works a brake pedal, the secondary battery performs regeneration charging, and this process repeats. Therefore, there is a need for a new approach to estimate a DOD of a secondary battery conveniently and correctly in a dynamic usage environment of the secondary battery.

DISCLOSURE

Technical Problem

The present disclosure is designed to solve the problem of the related art, and therefore, the present disclosure is directed to providing an apparatus and method for estimating a depth of discharging (DOD) of a secondary battery conveniently and correctly during dynamic use of the secondary battery.

Also, the present disclosure is directed to providing an apparatus and method that estimates conveniently and correctly a DOD of a secondary battery exhibiting a unique electrochemical behavior due to a blended cathode material including at least two cathode materials therein in consideration of improved performance required for secondary batteries in the market.

Technical Solution

In one aspect of the present disclosure, there is provided an apparatus for estimating a depth of discharging (DOD) of a secondary battery, which includes a sensor unit configured to repeatedly measure a voltage of a secondary battery including a blended cathode material containing at least first and second cathode materials at time intervals; and a control unit configured to receive the repeatedly measured plurality of voltages from the sensor unit, identify an inflection point in a voltage change profile corresponding to the plurality of voltages, and estimate a DOD of the secondary battery by using a voltage, measured after the inflection point is identified, as a reference voltage.

Preferably, the control unit may estimate the DOD by using a voltage measured after a predetermined time since the inflection point is identified as a reference voltage. Here, the predetermined time may be 5 to 60 seconds, preferably 20 to 40 seconds, more preferably 40 to 60 seconds. The predetermined time may vary depending on the kind of the secondary battery.

In an aspect, the control unit may estimate the DOD by using a lookup table or a lookup function which defines a correlation between the reference voltage and the DOD in advance.

In another aspect, the control unit may identify the inflection point when a voltage change rate (dV/dt) with respect to time is at the maximum in the voltage change profile.

In an embodiment, the control unit may identify the inflection point in a voltage change profile measured after the secondary battery stops charging or discharging.

In another embodiment, the control unit may identify the inflection point in a voltage change profile measured while the secondary battery is being charged.

Preferably, the secondary battery may have an open-circuit voltage profile including at least one inflection point or a discharge resistance profile including a convex pattern.

In another aspect, there is also provided an apparatus for estimating a DOD of a secondary battery, which includes a sensor unit configured to repeatedly measure a voltage of a secondary battery including a blended cathode material containing at least first and second cathode materials at time intervals; and a control unit configured to receive the repeatedly measured plurality of voltages from the sensor unit, identify an inflection point in a voltage change profile corresponding to the plurality of voltages, estimate a reference voltage, which is to be used for estimating a DOD of the secondary battery, by means of extrapolation from a plurality of voltages measured after the inflection point is identified, and estimate the DOD by using the reference voltage.

Preferably, the control unit may determine an approximation function for approximating a voltage change profile corresponding to the plurality of voltages measured after the inflection point is identified, and estimates a voltage corresponding to a predetermined time as the reference voltage by using the approximation function.

In an aspect, by using the approximation function, a voltage corresponding to a time after 20 seconds or more, preferably 30 seconds or more, more preferably 40 seconds or more, since the inflection point is identified, may be estimated as a reference voltage. The time when the reference voltage is set may vary depending on the kind of the secondary battery.

In an aspect, the control unit may estimate the DOD by using a lookup table or a lookup function which defines a correlation between the reference voltage and the DOD in advance.

In another aspect, the control unit may identify the inflection point when a voltage change rate (dV/dt) with respect to time is at the maximum in the voltage change profile.

In another aspect, the control unit may identify the inflection point in a voltage change profile measured after the secondary battery stops charging or discharging or in a voltage change profile measured while the secondary battery is being charged.

Preferably, the secondary battery may have an open-circuit voltage profile including at least one inflection point or a discharge resistance profile including a convex pattern.

In an aspect, the control unit may be coupled to a storage unit, and the control unit may store and maintain the estimated DOD in the storage unit.

In another aspect, the control unit may be coupled to a display unit, and the control unit may display the estimated DOD in the display unit using a graphic interface (letters, numbers, graphs or the like).

In another aspect, the control unit may be coupled to a communication interface, and the control unit may transmit the estimated DOD to an external control unit through the communication interface.

In another aspect of the present disclosure, there is also provided an electric-powered device which includes the above apparatus for estimating a DOD of a secondary battery.

In another aspect of the present disclosure, there is also provided a method for estimating a DOD of a secondary battery, which includes (a) receiving a plurality of voltages of a secondary battery repeatedly measured at time intervals, the secondary battery including a blended cathode material containing at least first and second cathode materials; (b) identifying an inflection point in a voltage change profile corresponding to the plurality of voltages; (c) selecting a voltage, measured after the inflection point is identified, as a reference voltage; and (d) estimating a DOD of the secondary battery by using the reference voltage.

In another aspect of the present disclosure, there is also provided a method for estimating a DOD of a secondary battery, which includes (a) receiving a plurality of voltages of a secondary battery repeatedly measured at time intervals, the secondary battery including a blended cathode material containing at least first and second cathode materials; (b) identifying an inflection point in a voltage change profile corresponding to the plurality of voltages; (c) estimating a reference voltage, which is to be used for estimating a DOD of the secondary battery, by means of extrapolation from a plurality of voltages measured after the inflection point is identified; and (d) estimating the DOD by using the estimated reference voltage.

The method for estimating a DOD of a secondary battery according to the present disclosure may further include: storing the estimated DOD, and/or displaying the estimated DOD, and/or transmitting the estimated DOD.

In the present disclosure, the first cathode material may be an alkali metal compound expressed by a general chemical formula $A[A_xM_y]O_{2+z}$, (A includes at least one of Li, Na and K; M includes at least one element selected from the group consisting of Ni, Co, Mn, Ca, Mg, Al, Ti, Si, Fe, Mo, V, Zr, Zn, Cu, Mo, Sc, Zr, Ru and Cr; $x \geq 0$, $1 \leq x+y \leq 2$, $-0.1 \leq z \leq 2$; and x, y, z and stoichiometric coefficients of the components included in M are selected so that the compound maintains electrically neutral), or an alkali metal compound, disclosed in U.S. Pat. No. 6,677,082 and U.S. Pat. No. 6,680,143, $xLiM^1O_2\text{-}(1\text{-}x)Li_2M^2O_3$ ($M^1$ includes at least one element having an average oxidation state equal to 3; $M^2$ includes at least one element having an average oxidation state equal to 4; $0 \leq x \leq 1$).

The second cathode material may be lithium metal phosphate expressed by a general chemical formula $Li_aM^1_x Fe_{1-x}M^2_yP_{1-y}M^3_zO_{4-z}$ wherein $M^1$ is at least one element selected from the group consisting of Ti, Si, Mn, Co, V, Cr, Mo, Fe, Ni, Nd, Mg and Al; $M^2$ is at least one element selected from the group consisting of Ti, Si, Mn, Co, V, Cr, Mo, Fe, Ni, Nd, Mg, Al, As, Sb, Si, Ge, V and S; $M^3$ is at least one selected from the group consisting of halogen elements containing F; $0<a\leq2$, $0\leq x\leq1$, $0\leq y<1$, $0\leq z<1$; and a, x, y, z, and stoichiometric coefficients of components included in $M^1$, $M^2$, and $M^3$ are selected so that the lithium metal phosphate maintains electrical neutrality or $Li_3M_2(PO_4)_3$ wherein M is at least one element selected from the group consisting of Ti, Si, Mn, Co, V, Cr, Mo, Ni, Mg and Al.

The secondary battery may further include an electrolyte including working ions, and a separator to electrically separate a cathode from an anode and allow the working ions to move. The electrolyte is not limited to a specific type if it includes working ions and may cause an electrochemical oxidation or reduction reaction at a cathode and an anode using the working ions.

The secondary battery may further include a casing to seal the cathode, the anode, and the separator. The casing does not have special limitation in its material if it has chemical safety.

An outer appearance of the secondary battery is determined by a structure of the casing. The structure of the casing may be one of the various structures known in the art, and typically, may have a cylindrical shape, a prismatic shape, a pouch shape, a coin shape, and the like.

Advantageous Effects

According to the present disclosure, a depth of discharging (DOD) of a secondary battery may be reliably estimated during dynamic charging of the secondary battery. Particularly, for a secondary battery including a blended cathode material showing a unique voltage change pattern, reliable estimation of a DOD may be also achieved.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

Figure 1:
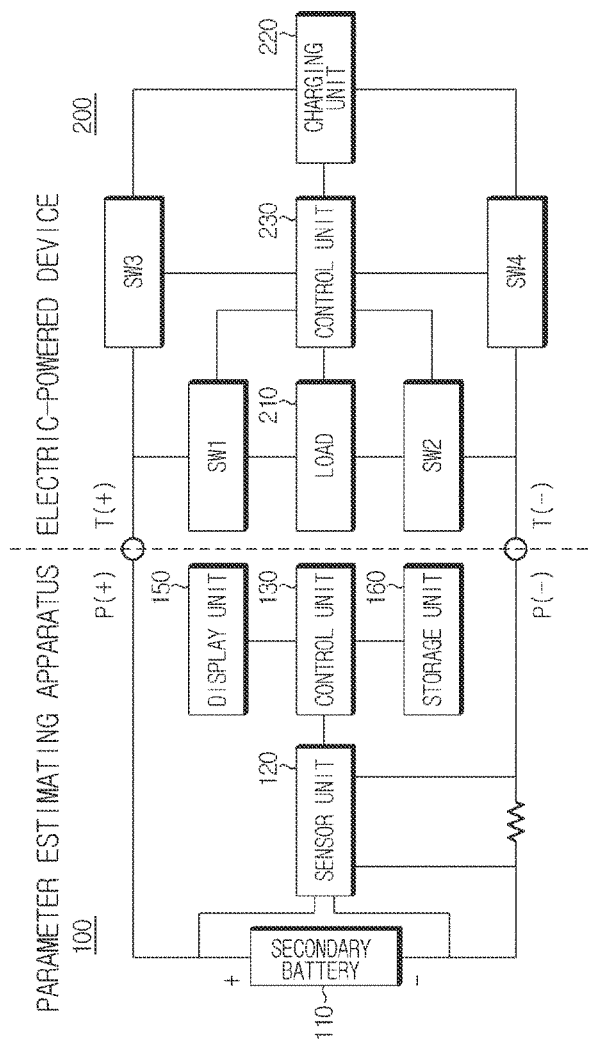
FIG. 1 is a block diagram schematically illustrating configuration of an apparatus for estimating a depth of discharging (DOD) of a secondary battery according to an exemplary embodiment of the present disclosure.

| Reference Symbols | |
|---|---|
| 100: DOD estimating apparatus | 200: electric-powered device |
| 110: secondary battery | 120: sensor unit |
| 130: control unit | 150: display unit |
| 160: storage unit | 210: load |
| 220: charging unit | 230: control unit |

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

The embodiments described below dictates a case in which the technical aspects of the present disclosure are applied to a lithium secondary battery. Here, a lithium secondary battery is a secondary battery in which lithium ions of working ions causes an electrochemical reaction at a cathode and an anode during charging and discharging. The working ions represent ions participating in the electrochemical oxidation and reduction reactions during charging and discharging of the secondary battery, and for example, lithium ions may work so. Accordingly, any secondary battery using lithium ions as working ions should be construed as being included in the scope of the lithium secondary battery even though the name of the secondary battery changes based on a type of an electrolyte or a separator used in the lithium secondary battery, a type of a casing used to package the secondary battery, an internal or external structure of the lithium secondary battery, and the like.

Also, the present disclosure may be applied to secondary batteries other than a lithium secondary battery. Accordingly, even though lithium ions are not working ions, any secondary battery to which the technical aspects of the present disclosure may be applied should be construed as being included in the scope of the present disclosure regardless of its type. It should be noted that, in certain embodiments in which the term 'secondary battery' is used instead of the term 'lithium secondary battery', a secondary battery in the corresponding embodiments is used as a concept of encompassing various types of secondary batteries.

Also, a secondary battery is not limited to a number of elements constituting the secondary battery. Accordingly, a secondary battery should be construed as including not only a unit cell including an anode, an electrolyte, and a cathode as a basic unit, but also an assembly of unit cells, a module produced by connecting a plurality of assemblies in series and/or in parallel, a pack produced by connecting a plurality of modules in series and/or in parallel, a battery system produced by connecting a plurality of packs in series and/or in parallel, and the like.

In the present disclosure, the secondary battery includes a cathode active material and an anode active material, and the cathode active material includes a blended cathode material containing at least a first cathode material and a second cathode material.

The first cathode material easily reacts with working ions in a high voltage range in comparison to the second cathode material. Therefore, when the secondary battery is charged or discharged in a high voltage range, working ions are preferentially intercalated into or deintercalated from the first cathode material. Meanwhile, the second cathode material easily reacts with working ions in a low voltage range in comparison to the first cathode material. Therefore, when the secondary battery is charged or discharged in a low voltage range, working ions are preferentially intercalated into or deintercalated from the second cathode material.

As described above, if voltage ranges in which the first and second cathode materials preferentially react with working ions are divided, a transition voltage range where the kind of cathode material reacting with working ions changes is generated while the secondary battery is charged or discharged. In addition, if the secondary battery is charged, is discharged or comes into a no-load state in a voltage range including the transition voltage range, a voltage change pattern including an inflection point is shown.

In addition, the secondary battery including a blended cathode material has a characteristic in which an internal resistance locally increases in the transition voltage range. In other words, if measuring a resistance of a secondary battery at each SOC, a convex pattern is observed near the transition voltage range, and two inflection points are observed before and after a peak of the convex pattern. Here, the SOC is a parameter representing a relative ratio of a presently remaining capacity in comparison to the capacity of a secondary battery in a fully charged state, and corresponds to "1-DOD".

Moreover, the secondary battery including a blended cathode material has an open-circuit voltage profile in which an inflection point is formed in the transition voltage range.

In other words, if measuring an open-circuit voltage of the secondary battery at each DOD, an inflection point is observed near the transition voltage range.

In an embodiment, the first cathode material may be an alkali metal compound expressed by a general chemical formula $A[A_xM_y]O_{2+z}$ (A includes at least one of Li, Na and K; M includes at least one element selected from the group consisting of Ni, Co, Mn, Ca, Mg, Al, Ti, Si, Fe, Mo, V, Zr, Zn, Cu, Mo, Sc, Zr, Ru and Cr; $x \geq 0$, $1 \leq x+y \leq 2$, $-0.1 \leq z \leq 2$; and x, y, z and stoichiometric coefficients of the components included in M are selected so that the compound maintains electrically neutral), or an alkali metal compound, disclosed in U.S. Pat. No. 6,677,082 and U.S. Pat. No. 6,680,143, $xLiM^1O_2-(1-x)Li_2M^2O_3$ ($M^1$ includes at least one element having an average oxidation state equal to 3; $M^2$ includes at least one element having an average oxidation state equal to 4; $0 \leq x \leq 1$).

In another embodiment, the second cathode material may be lithium metal phosphate expressed by a general chemical formula $Li_aM^1{}_xFe_{1-x}M^2{}_yP_{1-y}M^3{}_zO_{4-z}$ wherein $M^1$ is at least one element selected from the group consisting of Ti, Si, Mn, Co, V, Cr, Mo, Fe, Ni, Nd, Mg and Al; $M^2$ is at least one element selected from the group consisting of Ti, Si, Mn, Co, V, Cr, Mo, Ni, Nd, Mg, Al, As, Sb, Si, Ge, V and S; $M^3$ is at least one selected from the group consisting of halogen elements containing F; $0<a \leq 2$, $0 \leq x \leq 1$, $0 \leq y<1$, $0 \leq z<1$; and a, x, y, z, and stoichiometric coefficients of components included in $M^1$, $M^2$, and $M^3$ are selected so that the lithium metal phosphate maintains electrical neutrality or $Li_3M_2(PO_4)_3$ wherein M is at least one element selected from the group consisting of Ti, Si, Mn, Co, V, Cr, Mo, Ni, Mg and Al.

According to still another aspect, the first cathode material may be $Li[Li_aNi_bCo_cMn_d]O_{2+z}$, $[a \geq 0; a+b+c+d=1;$ at least one of b, c and d is not zero; $-0.1 \leq z \leq 2$], and the second cathode material may be $LiFePO_4$, $LiMn_xFe_yPO_4$ ($0<x+y \leq 1$) or $Li_3Fe_2(PO_4)_3$.

According to yet another aspect, the first cathode material and/or the second cathode material may include a coating layer. The coating layer may include a carbon layer, or may include an oxide layer or a fluoride layer including at least one element selected from the group consisting of Ti, Si, Mn, Co, Fe, V, Cr, Mo, Ni, Nd, Al, Mg, As, Sb, Si, Ge, V, and S.

In the present disclosure, the kinds and ratios of the first and second cathode materials are selected in consideration of the use and performance of a secondary battery to be manufactured such that a convex pattern appears in a discharge resistance profile measured at each SOC of the secondary battery (inflection points are shown before and after a peak of the convex pattern) or at least one inflection point appears in an open-circuit voltage profile measured at each DOD of the secondary battery.

In one embodiment, in the case where a secondary battery with high discharge power is desired, $Li[Ni_{1/3}Mn_{1/3}Co_{1/3}]O_2$ and $LiFePO_4$ may be selected as the first cathode material and the second cathode material, respectively, and a blending ratio of the first cathode material and the second cathode material may be set to 5:5.

In another embodiment, in the case where a secondary battery with high-temperature stability is desired, $Li[Ni_{1/3}Mn_{1/3}Co_{1/3}]O_2$ and $LiFePO_4$ may be selected as the first cathode material and the second cathode material, respectively, and a blending ratio of the first cathode material and the second cathode material may be set to 2:8.

In still another embodiment, in the case where a low cost secondary battery is desired, $Li[Ni_{1/3}Mn_{1/3}Co_{1/3}]O_2$ and LiFePO$_4$ may be selected as the first cathode material and the second cathode material, respectively, and a blending ratio of the first cathode material and the second cathode material may be set to 1:9.

In yet another embodiment, in the case where a secondary battery with high discharge power and high-temperature stability is desired, [Ni$_{1/3}$Mn$_{1/3}$Co$_{1/3}$]O$_2$ and LiFePO$_4$ may be selected as the first cathode material and the second cathode material, respectively, and a blending ratio of the first cathode material and the second cathode material may be set to 4:6.

In further another embodiment, in the case where a secondary battery with high capacity per weight is desired, Li[Ni$_{0.5}$Mn$_{0.3}$Co$_{0.2}$]O$_2$ and LiFePO$_4$ may be selected as the first cathode material and the second cathode material, respectively, and a blending ratio of the first cathode material and the second cathode material may be set to 9:1.

Methods of selecting the first cathode material and the second cathode material and adjusting the blending ratio as above are just one example. Accordingly, it is obvious to a person having ordinary skill in the art that the first cathode material and the second cathode material and the blending ratio thereof may be properly selected in consideration of a relative weight and balance of electrochemical properties with which a blended cathode material is characterized.

In the present disclosure, a number of cathode materials that may be included in the blended cathode material are not limited to two. As one embodiment, the blended cathode material may include three different cathode materials, for example, LiMn$_2$O$_4$, Li[Li$_a$Ni$_x$Co$_y$Mn$_z$O$_2$ [a≥0; x+y+z=1; at least one of x, y, and z is not zero], and LiFePO$_4$. As another embodiment, the blended cathode material may include four different cathode materials, for example, LiNiO$_2$, LiMn$_2$O$_4$, Li[Li$_a$Ni$_x$Co$_y$Mn$_z$O$_2$[a≥0; x+y+z=1; at least one of x, y, and z is not zero], and LiFePO$_4$.

Also, to enhance the properties of the blended cathode material, other additives, for example, a conductive material, a binder, and the like, may be added to the blended cathode material, and there is no particular limitation thereto. Accordingly, any blended cathode material including at least two cathode materials may be construed as being included in the scope of the present disclosure regardless of a number of cathode materials and the presence of other additives.

FIG. 1 is a block diagram schematically illustrating configuration of an apparatus 100 for estimating a depth of discharging (DOD) (hereinafter, also referred to as a DOD estimating apparatus) of a secondary battery according to an exemplary embodiment of the present disclosure.

Referring to FIG. 1, a high potential terminal and a low potential terminal (P+, P−) of the secondary battery 110 are electrically coupled with a low potential connection terminal and a high potential connection terminal (T+, T−) of an electric-powered device 200.

The secondary battery 110 may be a lithium secondary battery, but the present disclosure is not limited by a battery type.

In one embodiment, the electric-powered device 200 may be a mobile computer device such as a mobile phone, a laptop computer, and a tablet computer, or a handheld multimedia device including a digital camera, a video camera, and audio/video player.

In another embodiment, the electric-powered device 200 may be an electric transport system powered by electricity such as an electric vehicle, a hybrid vehicle, an electric bike, an electric motorcycle, an electric train, an electric boat, an electric aircraft, or a power tool including a motor such as electric drill and an electric grinder.

In still another embodiment, the electric-powered device 200 may be a large capacity energy storage system installed in an electrical grid to store renewable energy or excess energy of a electricity-generating plant, or an interruptible power supplier to supply power to various information and communication systems including a server computer or a mobile communication equipment in case of emergency such as blackout.

The electric-powered device 200 includes a load 210 and/or a charging unit 220.

The load 210 is a device that consumes electrical energy of the secondary battery 110, and as a non-limiting example, may be a rotary drive device such as a motor or a power conversion device such as a converter or an inverter.

The charging unit 220 is a device that applies a charging current to the secondary battery 110, and as a non-limiting example, may be a charging circuit, a generator coupled to an engine of an electric drive vehicle, a regeneration charger coupled to a brake of an electric-powered vehicle, and the like.

The charging unit 220 may apply a constant-current charge current, a pulse-type charge current, a variable charge current whose magnitude changes according to time, or the like to the secondary battery 110 under the control of the control unit 230.

The electric-powered device 200 may include a control unit 230 to control operation of the load 210 and/or the charging unit 220. The control unit 230 may include a microcomputer to execute a software algorithm for controlling operation of the electric-powered device 200.

The electric-powered device 200 may also include first through fourth switches SW1-SW4 to selectively connect the secondary battery 110 to the load 210 or the secondary battery 110 to the charging unit 220.

The first and second switches SW1 and SW2 turns on or off an electrical connection between the secondary battery 110 and the load 210 in response to a control signal received from the control unit 230.

The third and fourth switches SW3 and SW4 turns on or off an electrical connection between the secondary battery 110 and the charging unit 220 in response to a control signal received from the control unit 230.

Preferably, the first through fourth switches SW1-SW4 may be a semiconductor switch or a mechanical relay switch.

The control unit 230 turns on or off an electrical connection between the secondary battery 110 and the load 210 or between the secondary battery 110 and the charging unit 220.

In one example, when a state of charge (SOC) of the secondary battery 110 is high, the control unit 230 connects the secondary battery 110 to the load 210 by turning on the first and second switches SW1 and SW2, to operate the load 210 by electrical energy stored in the secondary battery 110. Then, the secondary battery 110 is discharged so that electrical energy is provided to the load 210.

In another example, when a SOC of the secondary battery 110 is low, the control unit 230 connects the secondary battery 110 to the charging unit 220 by turning on the third and fourth switches SW3 and SW4, to apply a charging current to the secondary battery 110. Then, the charging unit 220 applies a charging current to the secondary battery 110.

In an embodiment, during operation of the load 210, the control unit 230 connects the secondary battery 110 to the load 210, and when the operation of the load 210 is temporarily stopped, may connect the secondary battery 110 to the charging unit 220 to charge the secondary battery 110.

As a typical example of the above embodiment, regeneration charging of an electric vehicle or a hybrid vehicle may be given. The regeneration charging refers to charging of a secondary battery using regeneration energy produced by a brake system when the vehicle slows down through brake manipulation.

During the regeneration charging, a magnitude of a charging current gradually increases from zero to a predetermined peak value and then gradually decreases to zero. In this embodiment, the charging unit 220 is systemically associated with the brake system that produces regeneration energy, and the control unit 230 may control an overall regeneration charging process. Because the regeneration charging technology is widely known in the technical field to which the present disclosure belongs, its detailed description is omitted herein.

The DOD estimating apparatus 100 includes a sensor unit 120 and a control unit 130 in order to estimate a depth of discharging (DOD) of the secondary battery 110.

Here, the DOD is a parameter representing a relative ratio of a discharged capacity in comparison to a fully-charged capacity of the secondary battery by using a percentage or a number from 0 to 1. For example, if the DOD is 30%, this means that a capacity corresponding to 30% of the fully charged capacity of the secondary battery is discharged. The DOD is substantially identical to "1-SOC". Therefore, it should be understood that estimating the DOD is substantially identical to estimating a SOC.

The sensor unit 120 includes a voltage measurement circuit, and the sensor unit 120 measures a dynamic voltage and/or a no-load voltage of the secondary battery 110 and provides the dynamic voltage and/or the no-load voltage to the control unit 130.

Here, the dynamic voltage means a voltage applied between a cathode and an anode of the secondary battery 110 when the secondary battery 110 is being charged or discharged. In addition, the no-load voltage means a voltage applied between a cathode and an anode of the secondary battery 110 when the secondary battery 110 completely stops charging and discharging or a discharge current is negligibly low.

The sensor unit 120 may receive a measurement control signal from the control unit 130 to measure a voltage of the secondary battery 110. That is, the sensor unit 120 may measure a voltage of the secondary battery and provide the same to the control unit 130 whenever the measurement control signal is received.

In an embodiment, the sensor unit 120 repeatedly measures a voltage of the secondary battery 110 at time intervals and provides the measured voltage to the control unit 130 while the secondary battery 110 is being charged or discharged or the second battery 110 is in a no-load state.

Meanwhile, if the secondary battery 110 including a blended cathode material is charged in a voltage range including a transition voltage range, the voltage change profile of the secondary battery 110 has an increasing pattern in which an inflection point is formed.

Figure 2:
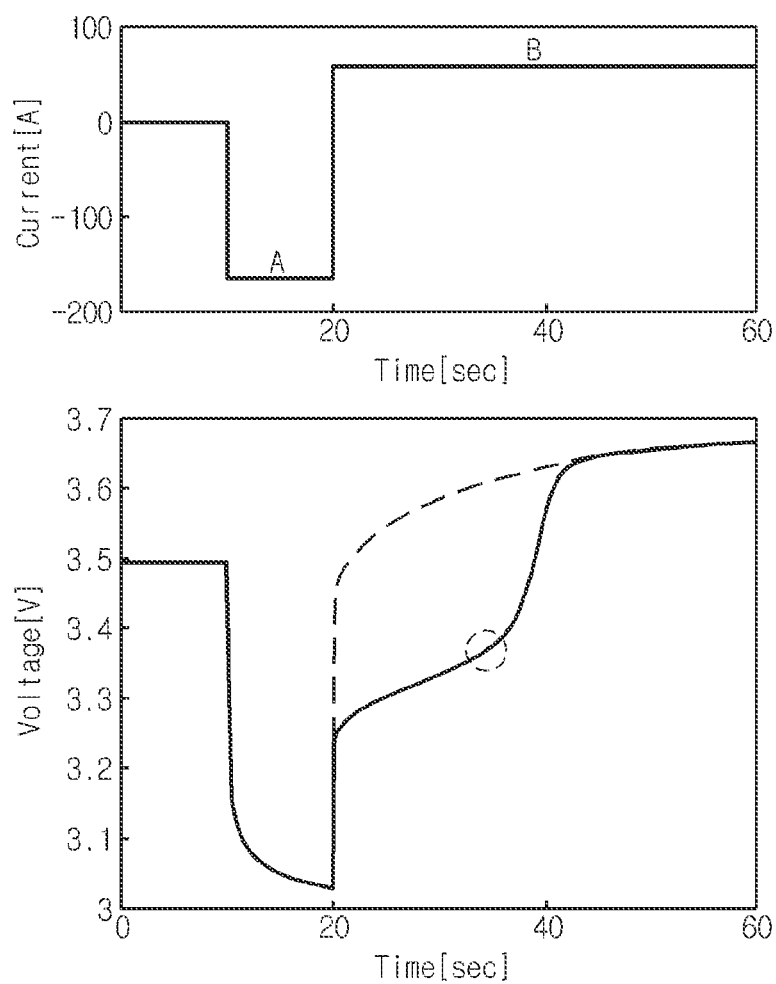
FIG. 2 shows a voltage change profile, observed when a lithium secondary battery including a blended cathode material in which $LiCo_{1/3}Mn_{1/3}Ni_{1/3}O_2$ and $LiFePO_4$ are blended at a ratio of 7:3 (weight ratio) as first and second cathode materials is charged in a voltage region including a transition voltage range.

FIG. 2 shows a voltage change profile, observed when a lithium secondary battery including a blended cathode material in which $LiCo_{1/3}Mn_{1/3}Ni_{1/3}O_2$ and $LiFePO_4$ are blended at a ratio of 7:3 (weight ratio) is charged in a voltage region including a transition voltage range (about 3.3V to 3.4V). In the current profile of FIG. 2, the section A represents a discharge region, and the section B represents a charge region.

$LiCo_{1/3}Mn_{1/3}Ni_{1/3}O_2$ easily reacts with working ions in a high voltage range, and $LiFePO_4$ easily reacts with working ions in a low voltage range. Therefore, as shown in FIG. 2, an inflection point (see a dotted circle) is formed on the voltage change profile of the lithium secondary battery. The inflection point supports that the kind of cathode material reacting with working ions is changed, and thus it may be regarded that the cathode materials from which working ions are deintercalated is changed from $LiFePO_4$ into $LiCo_{1/3}Mn_{1/3}Ni_{1/3}O_2$ near the inflection point. For reference, when the secondary battery is charged, working ions are deintercalated from cathode material. As described above, if the cathode material from which working ions are deintercalated is changed, the resistance characteristic of the secondary battery is changed, and this change of resistance characteristic is represented as an inflection point on the voltage change profile.

In addition, if the secondary battery including a blended cathode material comes into a no-load state while being discharged to a voltage lower than the transition voltage range (about 3.3V to 3.4V), the voltage change profile of the lithium secondary battery has an increasing pattern including an inflection point.

Figure 3:
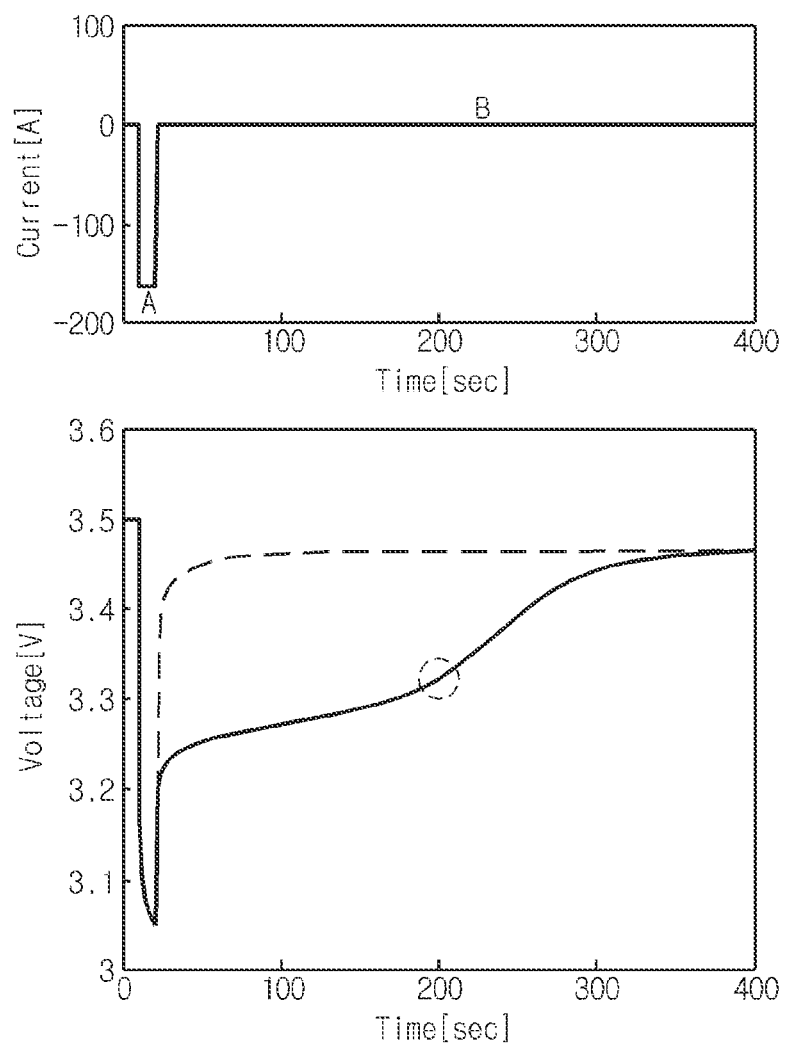
FIG. 3 shows a voltage change profile, observed when a lithium secondary battery including a blended cathode material in which $LiCo_{1/3}Mn_{1/3}Ni_{1/3}O_2$ and $LiFePO_4$ are blended at a ratio of 7:3 (weight ratio) as first and second cathode materials is discharged to a voltage lower than the transition voltage range (lower than 3.2V) and then comes into a no-load state.

FIG. 3 shows a voltage change profile, observed when a lithium secondary battery including a blended cathode material in which $LiCo_{1/3}Mn_{1/3}Ni_{1/3}O_2$ and $LiFePO_4$ are blended at a ratio of 7:3 (weight ratio) as first and second cathode materials is discharged to a voltage lower than the transition voltage range (lower than 3.2V) for several seconds and then comes into a no-load state. In the current profile of FIG. 3, the section A represents a discharge region, and the section B represents a no-load region.

Referring to FIG. 3, it may be observed that an inflection point (see a dotted circle) is formed on the voltage change profile. The inflection point is formed with a mechanism slightly different from the case where the secondary battery is charged. First, if the secondary battery is discharged to a voltage lower than the transition voltage range (lower than 3.2V), the capacity capable of intercalating working ions into $LiCo_{1/3}Mn_{1/3}Ni_{1/3}O_2$ is mostly used, and thus the resistance of $LiCo_{1/3}Mn_{1/3}Ni_{1/3}O_2$ rapidly increases. For this reason, working ions start being inserted into $LiFePO_4$, instead of $LiCo_{1/3}Mn_{1/3}Ni_{1/3}O_2$. In addition, if working ions are intercalated into $LiFePO_4$ to some extent and then the secondary battery comes into a no-load state, the operating ions intercalated into the surfaces of $LiCo_{1/3}Mn_{1/3}Ni_{1/3}O_2$ and $LiFePO_4$ are diffused inwards and the voltage of the secondary battery slowly increases. However, as the working ions are diffused inwards, a potential difference is created between two cathode materials, and due to the potential difference, the working ions intercalated into $LiFePO_4$ are moved toward $LiCo_{1/3}Mn_{1/3}Ni_{1/3}O_2$. Due to the working ion movement mechanism, the resistance characteristic of the secondary battery changes according to time, and the change of resistance characteristic results in an inflection point observed on the voltage change profile. The inflection point may be regarded as being created when the working ions intercalated into $LiFePO_4$ are mostly moved to $LiCo_{1/3}Mn_{1/3}Ni_{1/3}O_2$.

As described above, in the voltage change profile, an inflection point is generated since the resistance characteristic of the secondary battery is changed as the kind of cathode material reacting (intercalation or deintercalation) with working ions is changed. Therefore, it may be regarded that an inflection point is observed in a voltage change profile if the kind of cathode material reacting with working ions is changed, regardless of whether the secondary battery is being charged or discharged or whether the secondary battery is in a no-load state.

Meanwhile, the inventors of this application have found that when an inflection point is observed in a voltage change profile of a secondary battery, as long as the DOD of the secondary battery is identical, the voltage change profile has an intrinsic pattern according to the DOD of the secondary battery after the inflection point is observed, regardless of a charge history or a discharge history of the secondary battery.

Therefore, if a correlation between the voltage change profile after the inflection point and the DOD is defined in advance through experiments or the like, the DOD may be simply estimated using the voltage change profile after the inflection point.

For example, the correlation may be a correlation between the DOD and a reference voltage measured after a predetermined time since the inflection point is created on the voltage change profile. Here, at least one reference voltage may be measured.

The correlation may be obtained by measuring a voltage change profile of the secondary battery for each DOD of the secondary battery as shown in FIGS. 2 and 3.

As another example, the correlation may be a correlation between the DOD and an approximation function of a voltage change profile measured for a predetermined time after the inflection point is created.

Referring to FIGS. 2 and 3, since the voltage change profile after the inflection point converges to an equilibrium voltage, the voltage change profile may be expressed with an approximation function using extrapolation. For example, the approximation function may be an exponential function of a natural logarithm (e).

If the sensor unit 120 repeatedly measures and provides a voltage of the secondary battery according to the measurement control signal, the control unit 130 receives the voltage in order to estimate a DOD of the secondary battery 110 by using the voltage change profile including an inflection point.

The control unit 130 may generate a voltage change profile according to time by receiving the repeatedly measured voltages and identify an inflection point in the voltage change profile.

Here, the inflection point is identified at a location where the voltage change rate (dV/dt) for time is maximum on the voltage change profile. However, the method for identifying an inflection point is not limited thereto.

In an embodiment, the control unit 130 may identify the inflection point in a voltage change profile measured just after the secondary battery 110 stops charging or discharging.

In another embodiment, the control unit 130 may identify the inflection point in a voltage change profile measured while the secondary battery 110 is being charged.

If an inflection point is identified in the voltage change profile, the control unit 130 selects a voltage measured after the identification point of the inflection point as a reference voltage which is to be used for estimating a DOD of the secondary battery 110.

Preferably, the control unit 130 selects a voltage measured after a predetermined time since the inflection point is identified as a reference voltage. Here, the greater the predetermined time, the better.

For example, the predetermined time may be 5 to 60 seconds. As another example, the predetermined time may be 20 to 40 seconds. As another example, the predetermined time may be 40 to 60 seconds.

If the reference voltage is selected, the control unit 130 may estimate a depth of discharging (DOD) of the secondary battery from the selected reference voltage by using the predetermined correlation between the reference voltage and the DOD.

For example, the control unit 130 may estimate the DOD by using a lookup table or a lookup function in which a correlation between the reference voltage and the DOD is predefined.

Here, in the lookup table, a correlation between the reference voltage and the DOD obtained through experiments or the like is stored in a table form. In the lookup table, if a DOD corresponding to the reference voltage is mapped, the DOD of the secondary battery 110 may be simply estimated.

The lookup function shows a correlation between the reference voltage and the DOD obtained through experiments or the like as a function. Since the lookup function uses the reference voltage and the DOD as an input parameter and an output parameter, respectively, if the reference voltage as an input parameter of the lookup function is put thereto, the DOD may be obtained as an output value of the lookup function. Preferably, the lookup function may be obtained by means of a numerical analysis technique.

Meanwhile, a DOD of the secondary battery 110 has dependency on temperature. Accordingly, a temperature parameter may be further added to the lookup table and the lookup function. That is, the lookup table and the lookup function may be prepared for each temperature. In this case, the sensor unit 120 may further measure a temperature of the secondary battery 110 and provide the temperature of the secondary battery 110 to the control unit 130. Then, the control unit 130 may identify a lookup table or lookup function corresponding to the temperature of the secondary battery 110, and may estimate a DOD of the secondary battery 110 corresponding to the reference voltage using the identified lookup table or lookup function.

Meanwhile, the control unit 130 may estimate a DOD of the secondary battery in a different way from the above.

First, if an inflection point is identified in the voltage change profile, the control unit 130 may determine an approximation function corresponding to a voltage change profile measured for a predetermined time after the inflection point is identified. Here, the approximation function may be obtained through extrapolation and be expressed as an exponential function which converges to a specific value as time goes. An input parameter and an output parameter of the approximation function are respectively time and voltage.

After that, the control unit 130 estimates a voltage after a predetermined time since the inflection point is identified as a reference voltage by using the approximation function. The reference voltage may be determined by putting the predetermined time as an input parameter of the approximation function.

Preferably, the control unit 130 may estimate a voltage measured after 20 seconds or more, preferably 30 seconds or more, more preferably 40 seconds or more, since the inflection point is identified, as a reference voltage by using the approximation function.

If the reference voltage is estimated, the control unit 130 may estimate a DOD of the secondary battery corresponding to the reference voltage by using the lookup table or the lookup function which defines a correlation between the reference voltage and the DOD as described above. In this case, the temperature of the secondary battery 110 may also be additionally considered, as obvious to those skilled in the art.

In an embodiment of the present disclosure, the approximation function may be expressed as an exponential function V(t) as below by means of nonlinear curve fitting.

$$V(t)=a+be^{-ct+d}$$

In the function V(t), an input parameter and an output parameter are respectively time and voltage, and constants a, b, c and d are parameters which can be tuned by voltage data measured after the inflection point is identified. Since the function V(t) has a degree of freedom of 4, each constant may be determined by using at least four voltage data measured after the inflection point is identified.

Meanwhile, the approximation function may also be determined by using another nonlinear curve fitting technique which may fit a voltage change profile after the inflection point is identified.

For example, the approximation function may be determined by means of nonlinear regression, probability distribution fitting, polynomial curve fitting or the like.

However, the present disclosure is not limited thereto, and it is obvious that other techniques which are known in the art as being available for extrapolation may also be used to obtain the approximation function. In order to obtain the approximation function, the control unit 130 may execute a software algorithm in which at least one of the nonlinear curve fitting techniques mentioned above is programmed.

The DOD estimating apparatus 100 of the secondary battery may further include a storage unit 160. The storage unit 160 is not limited to a specific type if it is a storage medium capable of recording and erasing information.

For example, the storage unit 160 may be random access memory (RAM), read-only memory (ROM), a register, a hard disc, an optical recording medium, or a magnetic recording medium. Also, the storage unit 160 may be connected to the control unit 130 via, for example, a data bus, to allow access by the control unit 130.

The storage unit 160 may store and/or update and/or erase and/or transmit programs including various control logics executed by the control unit 130, and/or data generated by execution of the control logics, and/or algorithms determining an approximation function by nonlinear curve fitting.

As a non-limiting example, the storage unit 160 may be logically divided into at least two, and may be included in the control unit 130.

The storage unit 160 may store and maintain a plurality of voltages data measured by the sensor unit 120, the voltage change profile, information about the identified inflection point (time, voltage), the approximation function for a voltage change profile after the identified inflection point, the lookup table or the lookup function, the reference voltage, or the estimated DOD.

To execute various control logics and/or calculation logics, the control unit 130 may optionally include a processor, an application-specific integrated circuit (ASIC), a chipset, a logic circuit, a register, a communication modem, and a data processing device, well known in the art. Also, when a control logic is implemented in software, the control unit 130 may be implemented as an assembly of program modules. In this instance, the program module may be stored in a memory and executed by a processor. The memory may be disposed inside or outside a processor, and may be connected to a processor by various known means. Also, the memory may be included in the storage unit 160. Also, the memory generally represents all devices storing information regardless of a device type, and does not indicate a specific memory device.

The DOD estimating apparatus 100 of the secondary battery may further include a display unit 150. The display unit 150 is not limited to a specific type if it can display information about the DOD of the secondary battery 110 estimated by the control unit 130 as graphical interface (a character, a number, a graph, and the like).

As an example, the display unit 150 may be a liquid crystal display (LCD), a light-emitting diode (LED) display, an organic light-emitting diode (OLED) display, an electrophoretic ink (E-Ink) display, a flexible display, and the like.

The display unit 150 may be connected with the control unit 130 directly or indirectly. When the latter is employed, the display unit 150 may be located in a physically separate area from an area where the control unit 130 is located. Also, a third control unit (not shown) may be interposed between the display unit 150 and the control unit 130 to receive information to be displayed on the display unit 150 from the control unit 130 and allow the information to be displayed on the display unit 150. For this, the third control unit may be connected to the control unit 130 via a communication line (for example, a CAN communication network in a vehicle).

The display unit 150 is not necessarily included in the apparatus according to the present disclosure, and may be included in other apparatus connected with the apparatus according to the present disclosure. In this case, the display unit 150 and the control unit 130 may be indirectly connected via a control unit included in other apparatus rather than being directly connected. Accordingly, it should be understood that an electrical connection of the display unit 150 and the control unit 130 includes this indirect connection method.

The control unit 130 may form a communication interface with an external control device. Also, through the communication interface, data associated with the DOD of the secondary battery 110 may be transmitted to the external control unit. The external control unit may be a control unit 230 of the electric-powered device 200.

For example, in the case where the secondary battery 110 is mounted in an electric vehicle, the control unit 130 may transmit data associated with the DOD of the secondary battery 110 to the control unit 230 that controls an operating mechanism of the electric vehicle in an integrated manner. Then, the control unit 230 may control the charge and discharge of the secondary battery 110 using the received DOD of the secondary battery 110, and maximize the usage efficiency of the secondary battery 110.

In the description of various embodiments of the present disclosure, it should be understood that elements called 'unit' are distinguished functionally rather than physically.

Accordingly, each element may be selectively integrated with other element, or each element may be divided into sub-elements for efficient execution of the control logic(s). However, it is obvious to a person having ordinary skill in the art that even though elements are integrated or divided, if functions are found to be identical, the integrated or divided elements should be construed as falling within the scope of the present disclosure.

A selective combination of at least one of the various control logics and/or calculation logics of the control unit 130 may become an embodiment of a method for estimating the parameter of the secondary battery.

Figure 4:
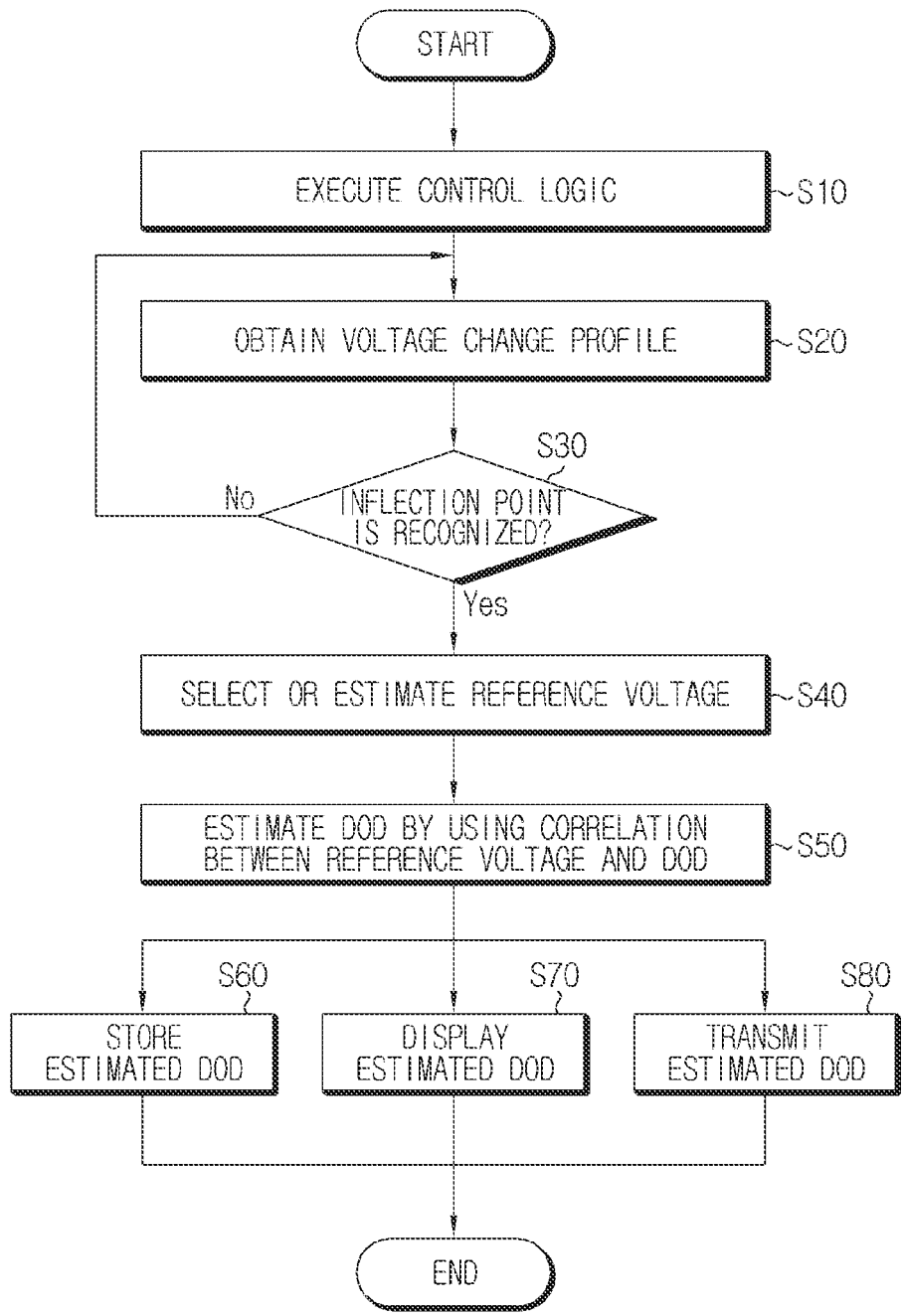
FIG. 4 is a flowchart for illustrating a method for estimating a DOD of a secondary battery according to an embodiment of the present disclosure.

FIG. 4 is a flowchart chronologically illustrating a method for estimating a DOD of a secondary battery according to an exemplary embodiment of the present disclosure.

First, in S10, the control unit 130 reads a control logic needed to estimate a DOD of a secondary battery from the storage unit 160 and executes the control logic.

Subsequently, in S20, the control unit 130 receives voltage data of the secondary battery 10 to obtain a voltage change profile by means of the sensor unit 120, while the secondary battery 110 is being charged or discharged, or after the secondary battery comes into a no-load state during a discharging process. The control unit 130 may periodically output a measurement control signal to the sensor unit 120 in order to obtain the voltage change profile.

Next, in S30, the control unit 130 identifies an inflection point on the voltage change profile. If an inflection point is not identified, the control unit 130 proceeds to Step S20, and if an inflection point is identified, the control unit 130 proceeds to Step S40.

Subsequently, in S40, the control unit 130 selects at least one voltage on a voltage change profile measured after a predetermined time after the inflection point is identified, as a reference voltage. When selecting the reference voltage, the control unit 130 may obtain an approximation function by means of extrapolation by using the voltage change profile measured after the inflection point is identified, and estimate a voltage, calculated as an output value by putting the predetermined time as an input parameter of the approximation function, as a reference voltage. When it is intended to estimate a plurality of voltages as a reference voltage, a plurality of time values may be input as an input parameter of the approximation function.

Next, in S50, the control unit 130 estimates a DOD corresponding to the measured reference voltage or the estimated reference voltage by using a lookup table or a lookup function which defines a correlation between the reference voltage and the DOD in advance through experiments or the like.

In the case where a temperature of the secondary battery 110 is taken into consideration when estimating the DOD of the secondary battery 110, the flowchart of FIG. 4 may further include a step in which the control unit 130 obtains data associated with the temperature of the secondary battery 110 using the sensor unit 120, and a step of estimating a DOD by using the look-up table or the look-up function corresponding to the temperature.

Also, the flowchart of FIG. 4 may further include, as an optional step, at least one step among steps S60 through S80.

That is, in S60, the control unit 130 may record the estimated DOD of the secondary battery 110 in the storage unit 160. Also, in S70, the control unit 130 may output the estimated DOD of the secondary battery 110 as graphical interface (a character, a number, a graph, and the like) through the display unit 150. Also, the control unit 130 may transmit the estimated DOD of the secondary battery 110 to the control unit 230 of the electric-powered device 200.

In the present disclosure, at least one of various control logics and/or calculation logics of the control unit 130 may be selectively combined, and the combined logics may be written in a computer-readable code and recorded in a computer-readable recording medium.

The recording medium is not limited to a specific type if it is accessible by a processor included in a computer. For example, the recording medium may include at least one selected from the group consisting of ROM, RAM, a register, a compact disc read-only memory (CD-ROM), a magnetic tape, a hard disc, a floppy disc, and an optical data recording device.

Also, the computer-readable code may be modulated to a carrier signal and included in a communication carrier at a particular point in time, and may be distributed over network-coupled computer systems so that the computer-readable code is stored and executed in a distributed fashion. Also, functional programs, codes, and code segments for implementing the combined control logics may be easily inferred by programmers in the technical field to which the present disclosure belongs.

Mode for Embodiment of the Invention

Hereinafter, a detailed description is provided through an experiment example. However, the experiment is for illustrative of the present disclosure only, and the scope of the present disclosure is not limited thereto.

Fabrication of Secondary Battery

A secondary battery including a blended cathode material was fabricated in accordance with the following specification.

Cathode material: Blended cathode material of $LiCo_{1/3}Ni_{1/3}Mn_{1/3}O_2$ and $LiFePO_4$ at a weight ratio of 7:3

Anode material: Graphite

Electrolyte: $LiPF_6$ added to a mixed solvent of EC (Ethyl Carbonate)/DMC (DiMethyl Carbonate)/EMC (Ethyl-Methyl Carbonate) mixed at a weight ratio of 3:4:3

Separator: Porous polyolefin film coated with inorganic particles on both surfaces Casing: Pouch casing Observation of Characteristics of Secondary Battery A secondary battery including a blended cathode material comprising at least two cathode materials exhibits a unique behavior in a discharge resistance profile and an open-circuit voltage profile.

Figure 5:
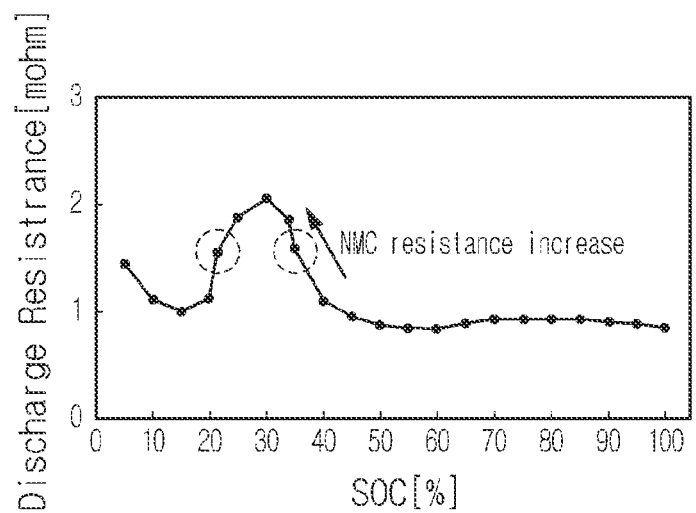
FIGS. 5 and 6 are graphs illustrating a discharge resistance profile of a secondary battery measured for each state of charge (SOC) of the secondary battery and an open-circuit voltage profile measured for each depth of discharge (DOD) of the secondary battery.
Figure 6:
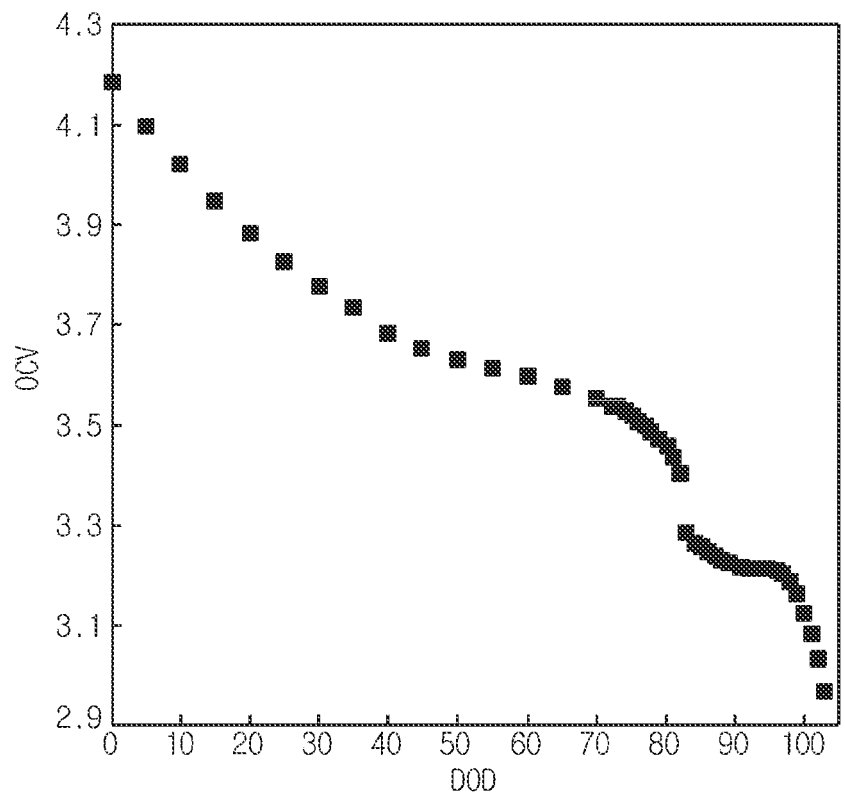

FIGS. 5 and 6 are graphs illustrating a discharge resistance profile of the secondary battery measured for each SOC of the secondary battery and an open-circuit voltage profile measured for each DOD of the secondary battery, respectively.

In the drawings, SOC stands for a state of charge, DOD stands for a depth of discharging, and numerically, DOD corresponds to (1-SOC).

Referring to FIG. 5, it can be observed that a convex pattern in which a discharge resistance of the secondary battery locally increases and then decreases appears, and two inflection points (see dotted circles) are present before and after a peak of the convex pattern. Also, referring to FIG. 6, an inflection point is also observed in an open-circuit voltage profile.

As shown, the reason that the convex pattern and the inflection point are observed in the discharge resistance profile and the open-circuit voltage profile, respectively, is that resistance characteristics of the secondary battery vary with a change in type of a cathode material reacting with the working ions when the secondary battery is used in the transition voltage range.

Charge/Discharge Experiment

Figure 7:
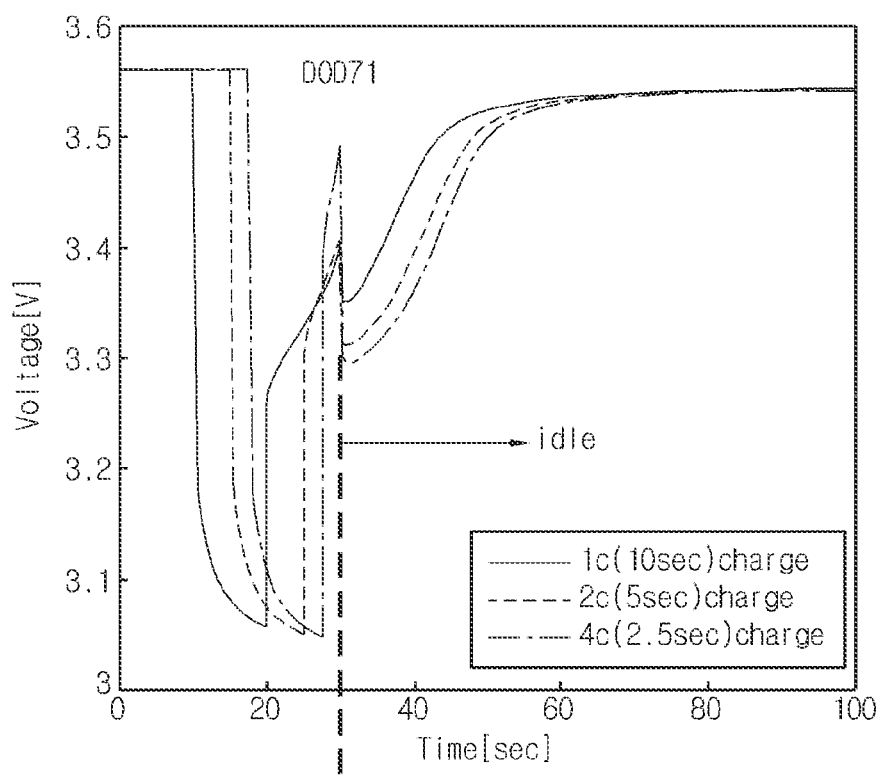
FIG. 7 shows voltage change profiles, each measured when a secondary battery is discharged in a voltage range including a transition voltage region of the secondary battery, thereafter charged during a short time period, and then maintained in an idle state for a predetermined time.

FIG. 7 is a graph showing a voltage change profile, measured when a secondary battery is discharged in a voltage range including a transition voltage region of the secondary battery, thereafter charged for a short time period and then maintained in an idle state for a predetermined time.

In FIG. 7, three voltage change profiles measured under different experiment conditions are depicted. In other words, the discharge rate was identical, and the charge rate was changed into three conditions. However, when the secondary battery was charged, the charging time was adjusted to have the same ampere counting. Therefore, even though charge rates are different depending on experiment conditions, the amount of working ions deintercalated from the cathode material when the secondary battery is charged is substantially identical. For this reason, when charging and discharging are completed, the DOD of the secondary battery is identically 71%. In each voltage change profile, the voltage rapidly drops in a discharge region, and the voltage rapidly increases again in a charge region. A region after 30 seconds is an idle region.

Referring to FIG. 7, in all of three voltage change profiles, an inflection point, namely a point where dV/dt becomes a maximum, is observed in the idle region. Therefore, it may be inferred that, when the secondary battery comes into an idle state, a potential difference is generated between two cathode materials due to the diffusion of working ions in the cathode material, and due to the potential difference, the working ions intercalated into $LiFePO_4$ move to $LiCo_{1/3}Ni_{1/3}Mn_{1/3}O_2$ so that the resistance characteristic of the secondary battery changes.

Figure 8:
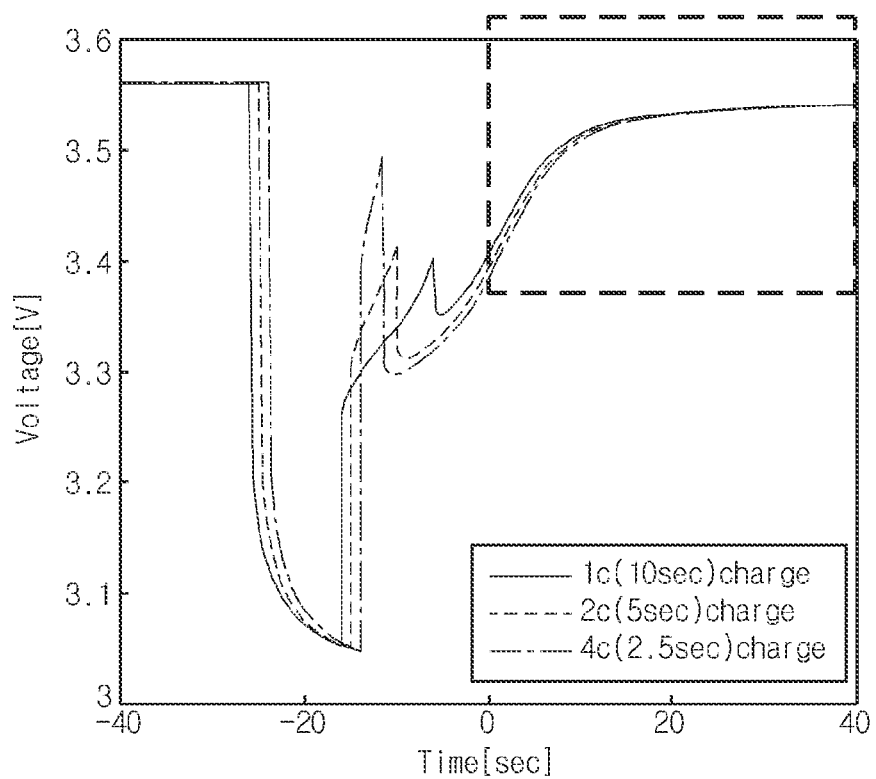
FIG. 8 shows graphs in which three voltage change profiles depicted in FIG. 7 are shifted so that inflection points of the three voltage change profiles are located on the straight line t=0.

FIG. 8 shows graphs in which three voltage change profiles depicted in FIG. 7 are shifted so that inflection points are located on the straight line t=0.

Figure 9:
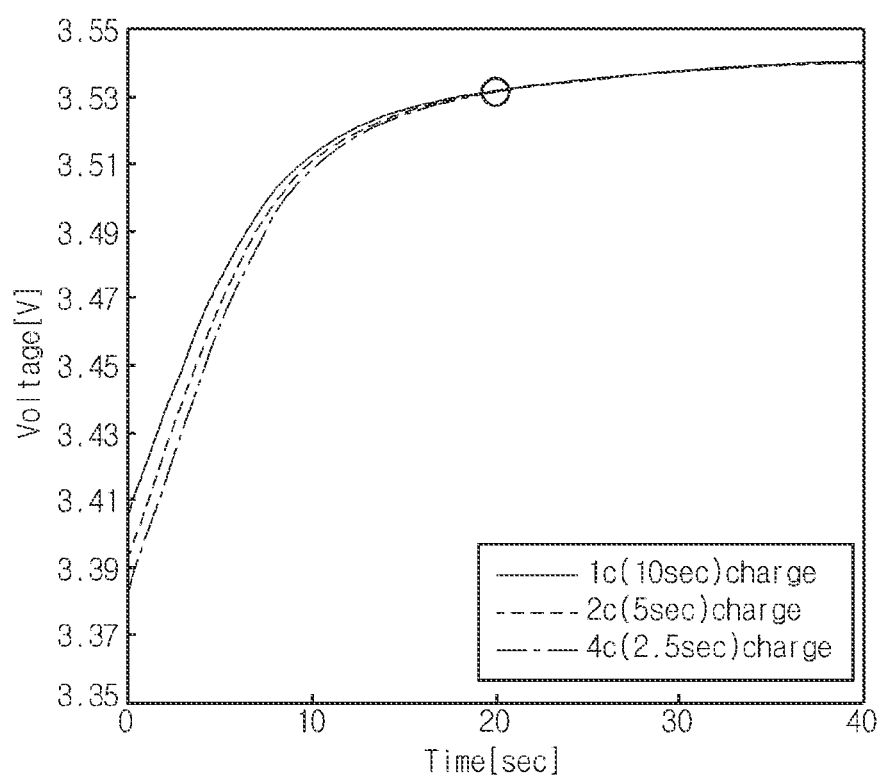
FIG. 9 is an enlarged graph showing a dotted box portion of FIG. 8.

FIG. 9 is an enlarged graph showing a dotted box portion of FIG. 8.

Figure 10:
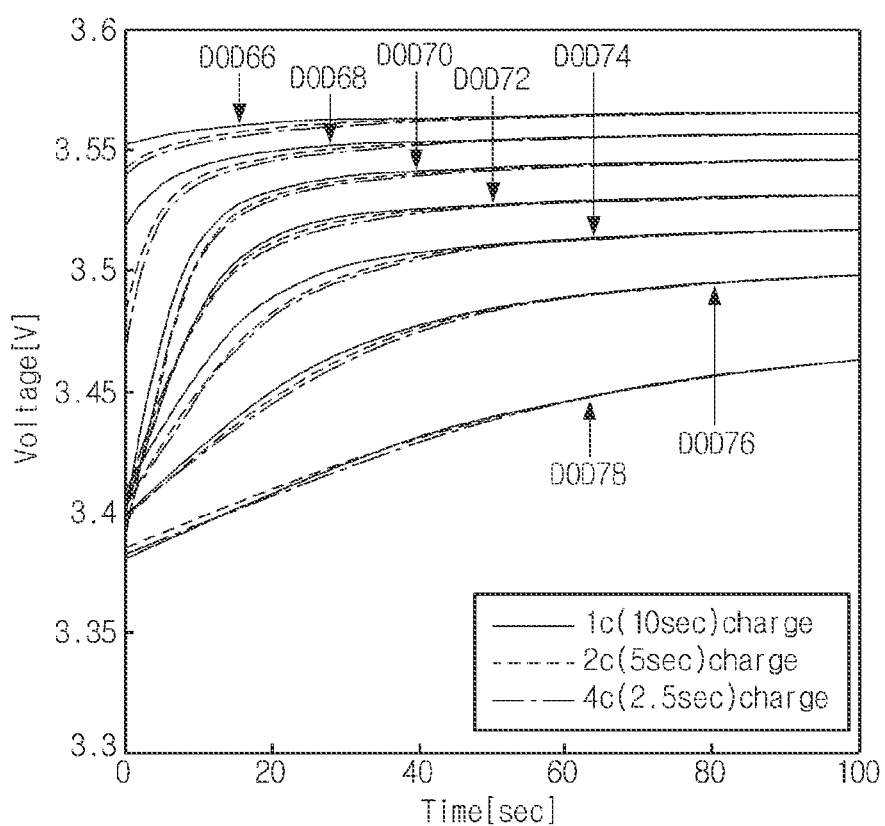
FIG. 10 is an enlarged view showing voltage change profiles, observed at the right side of the inflection point when a secondary battery is discharged and charged under the same condition as when obtaining the voltage change profiles of FIG. 7, while changing a DOD when the idle state is initiated.

FIG. 10 is an enlarged view showing voltage change profiles, observed at the right side of the inflection point when a secondary battery is discharged and charged under the same condition as when obtaining the voltage change profiles of FIG. 7, while changing a DOD when the idle state is initiated to 66%, 68%, 70%, 72%, 74%, 76% and 78%.

Referring to FIGS. 8 and 9, even though the voltage change profiles at the left side of the inflection point have different forms, as long as the DOD of the secondary battery is identical, it may be observed that the voltage change profiles at the right side of the inflection point converge to the same equivalent voltage (about 3.54V) while forming substantially the same profile form after a predetermined time (for example, 10 seconds).

This experiment result supports that the DOD of the secondary battery may be inherently estimated by identifying an inflection point in a voltage change profile of the secondary battery and sampling a voltage change profile at the right side of the inflection point.

For example, if a voltage change profile designated by a dashed dotted line is sampled when the secondary battery is in an idle state, a voltage (about 3.53V, see the circle mark) measured after a predetermined time, for example 20 seconds, since the inflection point is generated may be selected as a reference voltage for estimating a DOD of the secondary battery. In addition, if a lookup table or a lookup function defining a correlation between the reference voltage and the DOD through experiments is used, a DOD corresponding to the selected reference voltage may be simply estimated.

Meanwhile, the reference voltage used for determining a DOD of the secondary battery may also be estimated using an approximation function for a voltage change profile at the right side of the inflection point. In other words, an approximation function (for example, an exponential function) for approximately tracing a form of the voltage change profile after the inflection point may be calculated by means of extrapolation, and a voltage calculated as an output value when the predetermined time (for example, 20 seconds) is input as an input parameter of the approximation function may be estimated as a reference voltage.

This method is useful when the amount of voltage data measured after an inflection point is insufficient. In other words, the DOD may be more accurately estimated by approximately estimating an entire profile form as an approximation function by using a part of the voltage change profile, estimating a voltage when the voltage change profile is sufficiently converged to an equivalent voltage by using the approximation function, and selecting this value as a reference voltage.

FIG. 10 shows that even though different charging conditions are applied before the secondary battery comes into an idle state, as long as the DOD of the secondary battery is identical, the voltage change profiles at the right side of the inflection point converges to an equivalent voltage while forming substantially the same forms, under various DOD conditions.

Figure 11:
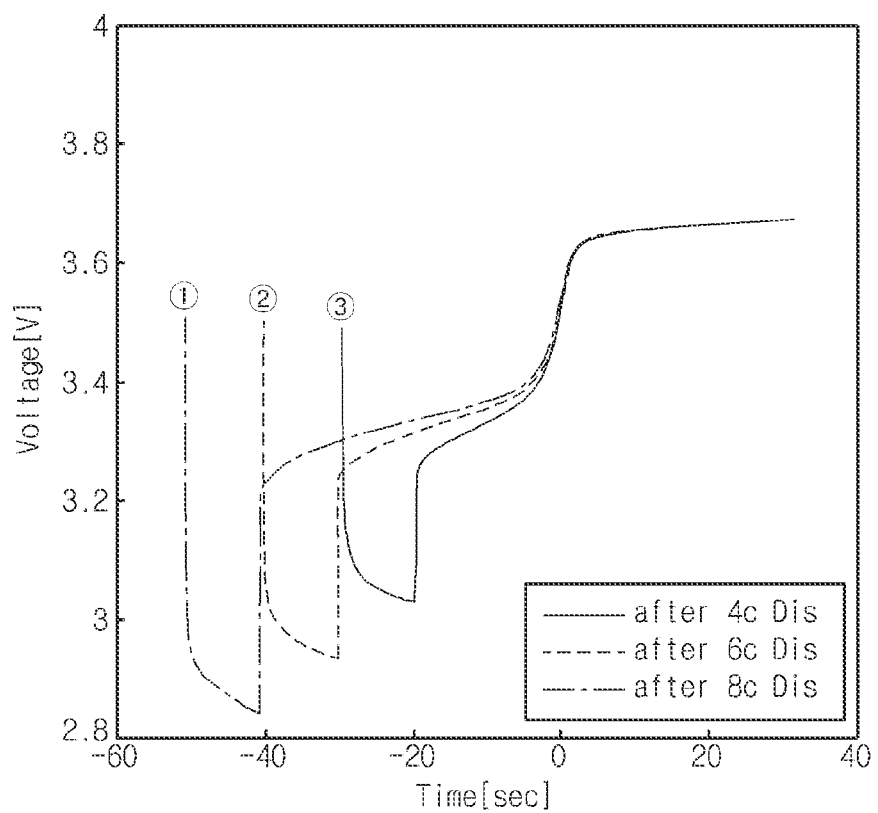
FIG. 11 shows a voltage change profile when a secondary battery is discharged in a voltage range including a transition voltage range and then charged again.

FIG. 11 shows a voltage change profile when a secondary battery is discharged in a voltage range including a transition voltage range and then charged again. The voltage change profiles ① to ③ are obtained through measurements at which discharge rates and charge rates are different from each other. However, after charging, all of DOD are identical. In addition, the voltage change profiles ① to ③ are shifted so that the inflection point is placed at a location of t=0.

Referring to FIG. 11, since the voltage change profiles ① to ③ include an inflection point in a region where the secondary battery is charged, it may be found that the cathode material from which working ions are deintercalated is changed from $LiFePO_4$ to $LiCo_{1/3}Ni_{1/3}Mn_{1/3}O_2$ near the inflection point.

In addition, regardless of the discharge rate and the charge rate, if the DOD is identical after charging is completed, it may be found that the voltage change profiles at the right side of the inflection point converge to a certain voltage while forming substantially the same form.

Figure 12:
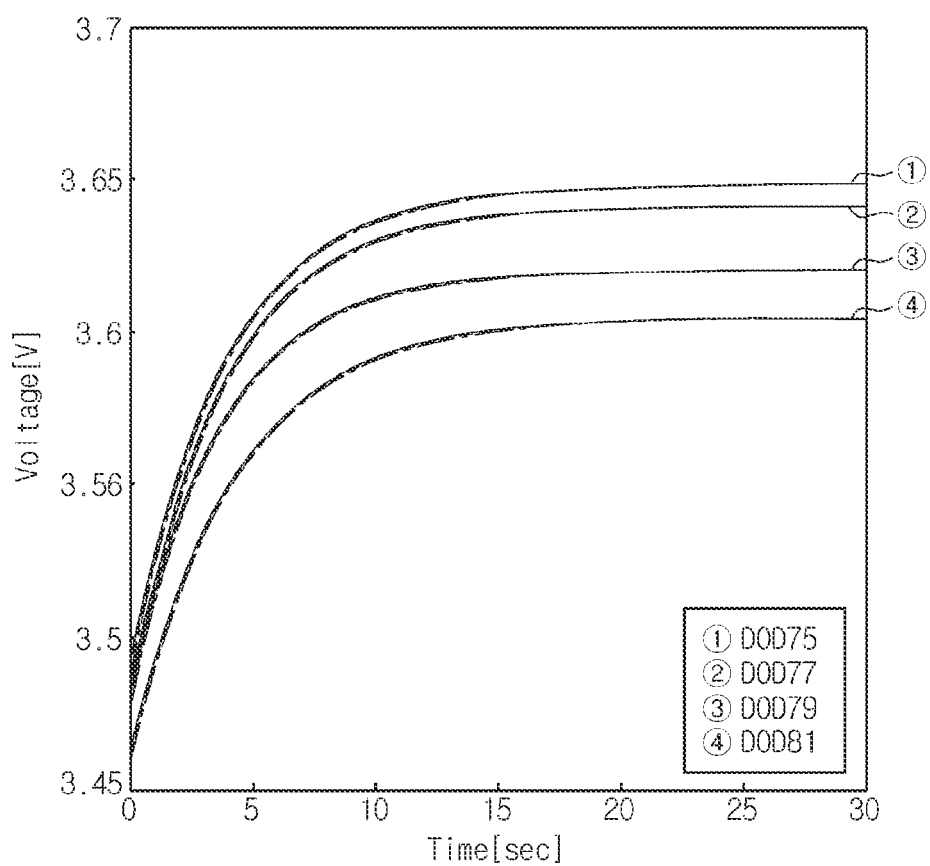
FIG. 12 shows voltage change profiles at the right side of an inflection point when experiment conditions are set so that DOD at the termination of charging becomes 75%, 77%, 79% and 81%, respectively, and a secondary battery is discharged and charged at different discharge rates and charge rates in the same way as when the voltage change profiles of FIG. 11 are obtained.

FIG. 12 shows a voltage change profile at the right side of an inflection point when experiment conditions are set so that DOD at the termination of charging becomes 75%, 77%, 79% and 81%, respectively, and a secondary battery is discharged and charged at different discharge rates and charge rates in the same way as when the voltage change profile of FIG. 11 is obtained.

Referring to FIG. 12, as long as the DOD at the termination of charging is identical, even though the secondary battery is charged or discharged at different discharge and charge rates, it may be observed that the voltage change profiles at the right side of the inflection point converges toward the equivalent voltage while forming substantially the same form. Even though FIG. 12 shows as if a single voltage change profile is drawn, in fact, three profiles, marked with a dotted line, a solid line and a dashed dotted line, are overlapped with each other.

Therefore, while the secondary battery is being charged in a voltage region including a transition voltage range, the DOD of the secondary battery may be simply estimated by using a reference voltage selected from the voltage change profile at the right side of the inflection point. As the reference voltage, a voltage measured after a predetermined time, for example 10, 20 or 30 seconds, since the inflection point is identified may be selected. In addition, the reference voltage may be estimated from the approximation function which is obtained from the voltage change profiles at the right side of the inflection point by means of extrapolation, as obvious to those skilled in the art.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An apparatus for estimating a depth of discharging (DOD) of a secondary battery, comprising:
   a sensor unit configured to repeatedly measure a voltage of a secondary battery including a blended cathode material containing at least first and second cathode materials at time intervals when the secondary battery is in an operation state or in an idle state; and
   a control unit configured to:
   receive the repeatedly measured plurality of voltages from the sensor unit,
   identify an inflection point indicative of changing of a cathode material reacting with working ions in a voltage change over time profile corresponding to the plurality of voltages,
   measure a voltage a predetermined time after the inflection point, and
   estimate a DOD of the secondary battery by using the voltage measured after the inflection point is identified as a reference voltage.

2. The apparatus for estimating a DOD of a secondary battery according to claim 1, wherein the control unit is configured to estimate the DOD by using a voltage measured after a predetermined time since the inflection point is identified as a reference voltage.

3. The apparatus for estimating a DOD of a secondary battery according to claim 1, wherein the control unit is configured to estimate the DOD by using a lookup table or a lookup function which defines a correlation between the reference voltage and the DOD in advance.

4. The apparatus for estimating a DOD of a secondary battery according to claim 1, wherein the control unit is configured to identify the inflection point when a voltage change rate (dV/dt) with respect to time is at the maximum in the voltage change profile.

5. The apparatus for estimating a DOD of a secondary battery according to claim 1, wherein the secondary battery has an open-circuit voltage profile including at least one inflection point or a discharge resistance profile including a convex pattern.

6. The apparatus for estimating a DOD of a secondary battery according to claim 1, further comprising:
   a storage unit configured to store the estimated DOD;
   a display unit configured to display the estimated DOD; or
   a communication interface configured to transmit the estimated DOD to the outside.

7. An electric-powered device, which comprises the apparatus for estimating a DOD of a secondary battery as defined in the claim 1.

8. An apparatus for estimating a DOD of a secondary battery, comprising:
   a sensor unit configured to repeatedly measure a voltage of a secondary battery including a blended cathode material containing at least first and second cathode materials at time intervals when the secondary battery is in an operation state or in an idle state; and
   a control unit configured to
   receive the repeatedly measured plurality of voltages from the sensor unit, identify an inflection point indicative of changing of a cathode material reacting with working ions in a voltage change over time profile corresponding to the plurality of voltages,
   estimate a reference voltage, which is to be used for estimating a DOD of the secondary battery, by means of extrapolation from a plurality of voltages measured at predetermined times after the inflection point is identified, and
   estimate the DOD by using the reference voltage.

9. The apparatus for estimating a DOD of a secondary battery according to claim 8, wherein the control unit is configured to determine an approximation function for approximating a voltage change profile corresponding to the plurality of voltages measured after the inflection point is identified, and estimate a voltage corresponding to a predetermined time as the reference voltage by using the approximation function.

10. The apparatus for estimating a DOD of a secondary battery according to claim 8, wherein the control unit is configured to estimate the DOD by using a lookup table or a lookup function which defines a correlation between the reference voltage and the DOD in advance.

11. The apparatus for estimating a DOD of a secondary battery according to claim 8, wherein the control unit is configured to identify the inflection point when a voltage change rate (dV/dt) with respect to time is at the maximum in the voltage change profile.

12. The apparatus for estimating a DOD of a secondary battery according to claim 8, wherein the secondary battery has an open-circuit voltage profile including at least one inflection point or a discharge resistance profile including a convex pattern.

13. The apparatus for estimating a DOD of a secondary battery according to claim 8, further comprising:
   a storage unit configured to store the estimated DOD;
   a display unit configured to display the estimated DOD; or
   a communication interface configured to transmit the estimated DOD to the outside.

14. An electric-powered device, which comprises the apparatus for estimating a DOD of a secondary battery as defined in the claim 8.

15. A method for estimating a DOD of a secondary battery, comprising:
   (a) receiving a plurality of voltages of a secondary battery, which have been repeatedly measured at time intervals when the secondary battery including a blended cathode material containing at least first and second cathode materials is in an operation state or in an idle state;
   (b) identifying an inflection point indicative of changing of a cathode material reacting with working ions in a voltage change over time profile corresponding to the plurality of voltages;
   (c) selecting a voltage, measured a predetermined time after the inflection point is identified, as a reference voltage; and
   (d) estimating a DOD of the secondary battery by using the reference voltage.

16. The method for estimating a DOD of a secondary battery according to claim 15, wherein in the step (b), the inflection point is identified when a voltage change rate (dV/dt) with respect to time is at the maximum in the voltage change profile.

17. The method for estimating a DOD of a secondary battery according to claim 15, wherein in the step (c), a voltage measured after a predetermined time since the inflection point is identified is selected as a reference voltage.

18. The method for estimating a DOD of a secondary battery according to claim 15, wherein in the step (d), the DOD is estimated by using a lookup table or a lookup function which defines a correlation between the reference voltage and the DOD in advance.

19. The method for estimating a DOD of a secondary battery according to claim 15, further comprising:
storing, displaying or transmitting the estimated DOD.

20. A method for estimating a DOD of a secondary battery, comprising:
(a) receiving a plurality of voltages of a secondary battery, which have been repeatedly measured at time intervals when the secondary battery including a blended cathode material containing at least first and second cathode materials is in an operation state or in an idle state;
(b) identifying an inflection point indicative of changing of a cathode material reacting with working ions in a voltage change over time profile corresponding to the plurality of voltages;
(c) estimating a reference voltage, which is to be used for estimating a DOD of the secondary battery, by means of extrapolation from a plurality of voltages measured at predetermined times after the inflection point is identified; and
(d) estimating the DOD by using the estimated reference voltage.

21. The method for estimating a DOD of a secondary battery according to claim 20, wherein in the step (b), the inflection point is identified when a voltage change rate (dV/dt) with respect to time is at the maximum in the voltage change profile.

22. The method for estimating a DOD of a secondary battery according to claim 20, wherein in the step (c), an approximation function for approximating a voltage change profile corresponding to the plurality of voltages measured after the inflection point is identified is determined, and a voltage corresponding to a predetermined time is estimated as the reference voltage by using the approximation function.

23. The method for estimating a DOD of a secondary battery according to claim 20, wherein in the step (d), the DOD is estimated by using a lookup table or a lookup function which defines a correlation between the reference voltage and the DOD in advance.

24. The method for estimating a DOD of a secondary battery according to claim 20, further comprising:
storing, displaying or transmitting the estimated DOD.

* * * * *